United States Patent
Scheuerlein

(10) Patent No.: US 7,943,515 B2
(45) Date of Patent: May 17, 2011

(54) SHARED MASKS FOR X-LINES AND SHARED MASKS FOR Y-LINES FOR FABRICATION OF 3D MEMORY ARRAYS

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 368 days.

(21) Appl. No.: 12/231,000

(22) Filed: Sep. 9, 2008

(65) Prior Publication Data

US 2010/0059796 A1 Mar. 11, 2010

(51) Int. Cl.
*H01L 21/027* (2006.01)
(52) U.S. Cl. ........ 438/671; 438/201; 438/210; 438/600; 438/749; 438/599
(58) Field of Classification Search .................. 438/201, 438/210–212, 128–132, 197, 381, 598–600, 438/749–751
See application file for complete search history.

(56) References Cited

U.S. PATENT DOCUMENTS

| | | | |
|---|---|---|---|
| 4,646,266 A | 2/1987 | Ovshinsky et al. | |
| 5,751,012 A | 5/1998 | Wolstenholme et al. | |
| 5,835,396 A | 11/1998 | Zhang | |
| 6,034,882 A | 3/2000 | Johnson et al. | |
| 6,055,180 A | 4/2000 | Gudesen et al. | |
| 6,185,122 B1 | 2/2001 | Johnson et al. | |
| 6,420,215 B1 | 7/2002 | Knall et al. | |
| 6,618,295 B2 | 9/2003 | Scheuerlein | |
| 6,631,085 B2 | 10/2003 | Kleveland et al. | |
| 7,081,377 B2 | 7/2006 | Cleeves | |
| 2003/0147266 A1 | 8/2003 | Vyvoda et al. | |
| 2005/0269553 A1 | 12/2005 | Sen et al. | |
| 2006/0222962 A1 | 10/2006 | Chen et al. | |
| 2007/0114508 A1 | 5/2007 | Herner et al. | |
| 2007/0176214 A1 | 8/2007 | Kwon et al. | |
| 2007/0178693 A1 | 8/2007 | Jeng | |

OTHER PUBLICATIONS

U.S. Appl. No. 09/560,626, filed Apr. 28, 2000, Knall.
U.S. Appl. No. 09/638,428, filed Aug. 14, 2000, Johnson.
Peter K. Naji et al., "A 256kb 3.0V 1T1MTJ Nonvolatile Magnetoresistive RAM", Digest of Technical Papers of the 2001 IEEE International Solid-State Circuits Conference, ISSCC 2001/ Session 7/Technology Directions: Advanced Technologies/7.6, Feb. 6, 2001, 3 pgs.
International Search Report with written opinion mailing date of Nov. 16, 2009 for International Application No. PCT/US2009/055850(9 pgs).

*Primary Examiner* — N Drew Richards
*Assistant Examiner* — Mamadou Diallo
(74) *Attorney, Agent, or Firm* — The Marbury Law Group, PLLC

(57) ABSTRACT

A structure and a method of manufacturing a three dimensional memory using a number of bit line masks that is less than the number of device layers. A first bit line mask is used to form a first bit line layer in a first device level. The first bit line layer comprises first bit lines. The first bit line mask is also used to form a second bit line layer in a second device level. The second bit line layer comprises second bit lines. The first bit lines and the second bit lines have different electrical connections to a bit line connection level despite employing the same mask pattern.

12 Claims, 10 Drawing Sheets

SHARED MASKS FOR X-LINES AND SHARED MASKS FOR Y-LINES FOR FABRICATION OF 3D MEMORY ARRAYS

BACKGROUND

The present invention relates generally to the field of semiconductor manufacturing and more specifically to three dimensional semiconductor memory devices and methods of making thereof.

During the fabrication of a semiconductor device, various lithographic masks are used to form structures on a substrate. Each lithographic step has its own mask. For critical levels, cost per mask is approximately $300,000 and increasing. Consequently, creating a mask set is very expensive. Moreover, creating a mask set for an experimental run can be prohibitively expensive. For example, fabricating eight levels of memory using a traditional unique mask for each design layer requires 24 critical masks in a back end of the line (BEOL) structure (i.e. metal interconnects). A mask set merely for the interconnects costs over seven million dollars.

A four layer three dimensional one time programmable (OTP) memory device typically consists of four layers of individual memory cells stacked on top of a device driver layer that is used to read and write the individual memory cells. Each individual cell has an associated word line and bit line. The word lines and bit lines are uniquely connected to the device driver layer by a chain of zias.

SUMMARY

One embodiment of the invention provides a method of manufacturing a three dimensional semiconductor device, comprising using a first bit line mask to form a first bit line layer in a first device level, wherein the first bit line layer comprises first bit lines, and using the first bit line mask to form a second bit line layer in a second device level, wherein the second bit line layer comprises second bit lines. The first bit lines and the second bit lines have different electrical connections to a bit line connection level.

Another embodiment of the invention provides a three dimensional semiconductor device, comprising a first bit line layer in a first device level, wherein the first bit line layer has a first bit line pattern, wherein the first bit line layer comprises first bit lines; and a second bit line layer in a second device level, wherein the second bit line layer has the first bit line pattern, wherein the second bit line layer comprises second bit lines. The first bit lines and the second bit lines have different electrical connections to a bit line connection level.

DETAILED DESCRIPTION

Figure 1:
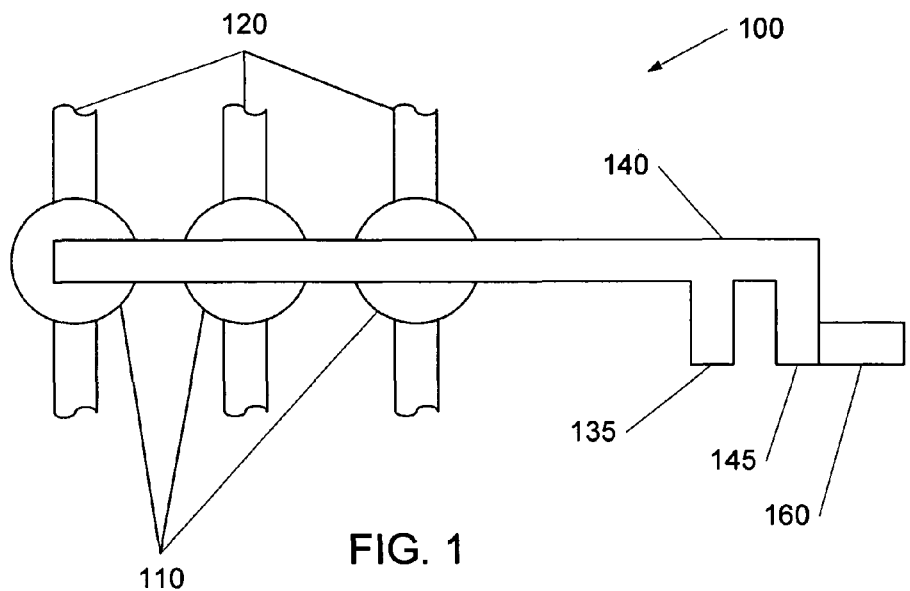
FIG. 1 is a top view of a memory cell subarray in accordance with an exemplary embodiment.

A structure and method for sharing masks for x-lines and sharing masks for y-lines for fabrication of three dimensional memory arrays are described. In the following description, for purposes of explanation, numerous specific details are set forth to provide a thorough understanding of exemplary embodiments of the invention. It will be evident, however, to one skilled in the art that the invention may be practiced without these specific details. The terms word lines, bit lines, x-lines, and y-lines are used interchangeably. The drawings are not to scale. The singular term mask includes all working plates based from a master mask. Hence, a master mask and its working plates have the same pattern. In other instances, well-known structures and devices are shown in simplified form to facilitate description of the exemplary embodiments.

In a four layer, three dimensional, one time programmable memory design the zia mask is used two times and the memory cell mask can be used multiple times. It should be noted that the use of the term "zia" as compared to the term "via" is not meant to restrict the embodiments of the invention and that embodiments of the invention may include either zia(s) or via(s) or both. Word line masks can be partially shared (e.g. segmented words) but bit line masks are not shared. Word line and bit line masks cannot be shared amongst levels simultaneously because there would not be unique connections to the individual memory cells. If word line and bit line masks were shared amongst levels simultaneously, four memory cells would be turned on at the same time.

The embodiments of the present invention describes a structure and method that allows both word line masks and bit line masks to be shared. For example, the number of masks for eight layers of memory can be reduced to six masks: one memory cell mask, one zia mask, one word line mask, and three bit line masks. Advantageously, the cost of a mask set is reduced substantially. The bit line masks can be used two or three times each resulting in increased manufacturing utilization. Additionally, experimental run mask sets are more cost effective. Advantageously, these lower cost mask sets make series of product variations more profitable.

One embodiment of the invention relates to a structure and a method of manufacturing a three dimensional memory using a number of bit line masks that is less than the number of device layers. A first bit line mask is used to form a first bit line layer in a first device level. The first bit line layer comprises first bit lines. The first bit line mask is also used to form a second bit line layer in a second device level. The second bit line layer comprises second bit lines. The first bit lines and the second bit lines have different electrical connections to a bit line connection level.

Another embodiment of the invention relates to a structure and a method of manufacturing a three dimensional memory using four bit line masks and one word line mask to fabricate an eight layer three dimensional memory device. The word line layers are shared between pairs of memory levels. Eight different electrical connections on eight different layers are made to individual bit line drivers on the bit line driver level despite using only four bit line masks.

Another embodiment of the invention relates to a structure and a method of manufacturing a three dimensional memory using three bit line masks, one word line mask, and a top metal (TM) strap. Word line layers are shared between pairs of memory levels. Two zia corridors each have three zia columns. Eight different electrical connections on eight different layers are made to individual bit line drivers on the bit line driver level despite using only three bit line masks.

Another embodiment of the invention relates to a structure and a method of manufacturing a three dimensional memory using three bit line masks, one word line mask, a top metal strap, and a X strap. Word line layers are shared between pairs of memory levels. Some of the zia corridors are shared. Eight different electrical connections on eight different layers are made to individual bit line drivers on the bit line driver level despite using only three bit line masks.

Another embodiment of the invention relates to a structure and a method of manufacturing a three dimensional memory using four bit line masks, one word line mask, and a top metal strap. Word line layers are shared between pairs of memory levels. Four zia corridors have one zia column and four zia corridors have two zia columns. Eight different electrical connections on eight different layers are made to individual bit line drivers on the bit line driver level despite using only four bit line masks.

Another embodiment of the invention relates to a structure and a method of manufacturing a three dimensional memory using four bit line masks and one word line mask. No top metal strap is used. Word line layers are shared between pairs of memory levels. Some zia corridors are shared. Eight different electrical connections on eight different layers are made to individual bit line drivers on the bit line driver level despite using only four bit line masks.

Referring to FIG. 1, a top view of a memory cell subarray 100 in accordance with an exemplary embodiment is shown. In this example, the memory cell subarray 100 includes two levels of memory cells fabricated as part of a semiconductor device (the first level is not visible). In the top view of memory cell subarray 100, memory cells 110, word lines 120, and a second bit line 140 are shown. The memory cells 110 are a one time programmable or a rewritable cell selected from at least one of antifuse, fuse, diode and antifuse arranged in a series, polysilicon memory effect cell, metal oxide memory, switchable complex metal oxide, carbon nanotube memory, phase change material memory, conductive bridge element, switchable polymer memory, or thin deposited carbon switchable resistor, such as amorphous, polycrystalline or microcrystalline carbon film. Preferably, the cells comprise a steering element, such as diode or transistor, and a storage element selected from one of the storage element types listed above. Preferably but not necessarily, each cell comprises a pillar having a cylindrical or other suitable shape in which the storage and steering elements are arranged in series between a word line and a bit line. The word lines 120, and the second bit line 140 are made of one or more conductive materials, such as aluminum, tungsten, titanium, titanium nitride, etc. The second bit line 140 includes a first tab 135 and a second tab 145 that project from the side of the second bit line 140. A zia 160 connects the second bit line 140 to other levels of the semiconductor device.

Figure 2:
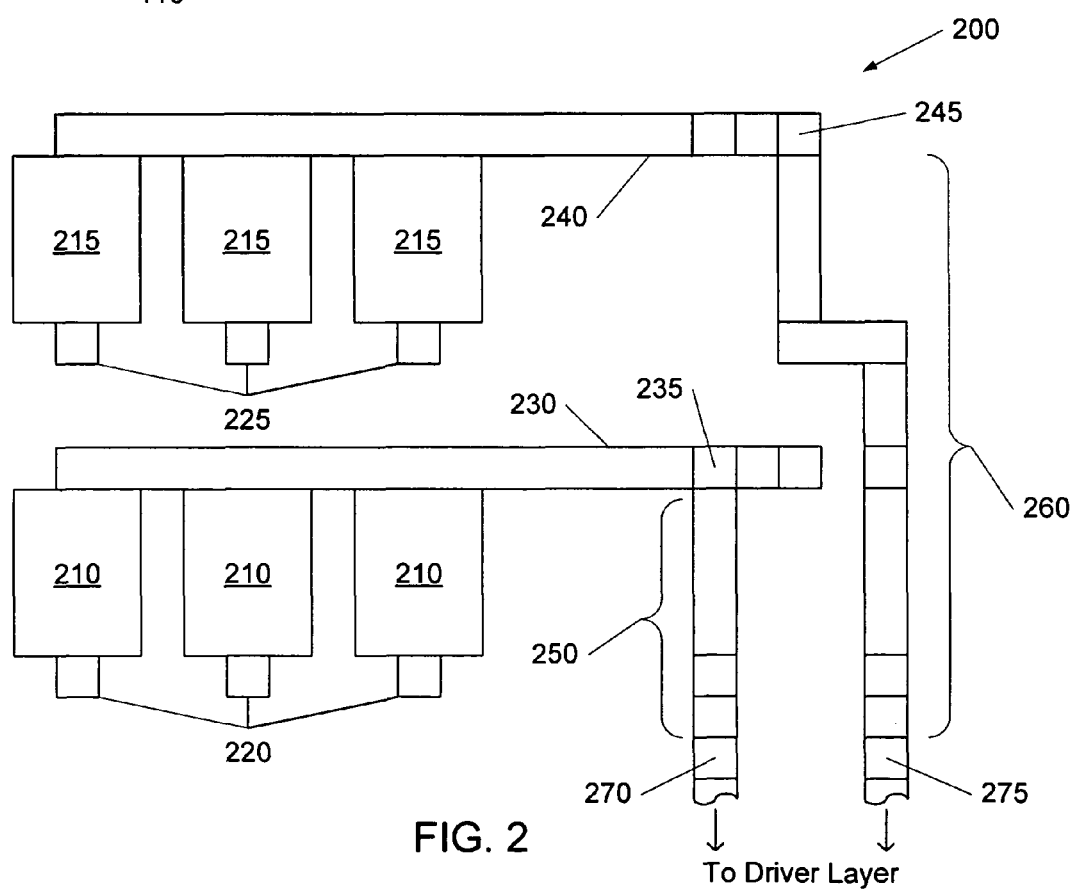
FIG. 2 is a side view of the memory cell subarray of FIG. 1 in accordance with an exemplary embodiment.

Referring to FIG. 2, a side view of the memory cell subarray 200 of FIG. 1 in accordance with an exemplary embodiment is shown. In this example, the memory cell subarray 200 includes two levels of memory cells. In the side view of memory cell subarray 200, first memory cells 210, second memory cells 215, first word lines 220, second word lines 225, a first bit line 230, and a second bit line 240 are shown. The first word lines 220 and the first bit line 230 are electrically connected through the first memory cells 210 so that current can flow from an individual word line to the first bit line 230. The first memory cells 210, first word lines 220, and the first bit line 230 are included in a first device level. The second word lines 225 and the second bit line 240 are electrically connected through the second memory cells 215 so that current can flow from an individual word line to the second bit line 240. The second memory cells 215, the second word lines 225, and the second bit line 240 are included in a second device level. Note that the first bit line 230, and the second bit line 240 have the same pattern.

The first bit line 230 includes a first tab 235 that projects from the side of the first bit line 230. The first tab 235 is connected to a first zia 250 that electrically connects the first bit line 230 to a first bit line connection 270 on a bit line connection layer. The first bit line connection 270 is electrically connected to a bit line driver in a driver level of the semiconductor device, such as a bit line driver located on a semiconductor substrate. The first zia 250 is a conductive path that is created during or after the various layers of the semiconductor device are fabricated. The second bit line 240 includes a second tab 245 that projects from the side of the second bit line 240. The second tab 245 is connected to a second zia 260 that electrically connects the second bit line 240 to a second bit line connection 275 on the bit line connection layer. The second bit line connection 275 is electrically connected to a bit line driver in the driver level of the semiconductor device. The second zia 260 is a conductive path that is created during or after the various layers of the semiconductor device are fabricated. The first bit line connection 270 and the second bit line connection 275 constitute the bit line connection layer. The first tab 235 and the second tab 245 enable electrical connections to the driver level of the semiconductor device despite that the second bit line 240 is directly above the first bit line 230 and despite that the first bit line 230 and the second bit line 240 have the same pattern. Electrical connections cannot be in the direct path of the first bit line 230 and the second bit line 240 when the same bit line mask is used to fabricate more than one bit line level—this becomes readily apparent when multiple device levels are considered.

Figure 3:
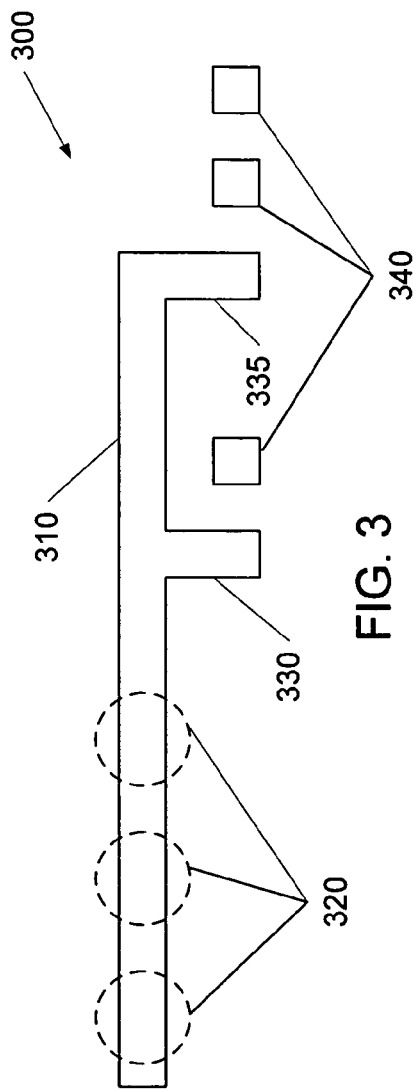
FIG. 3 is a top view of a bit line level in accordance with an exemplary embodiment.

Referring to FIG. 3, a top view of a bit line level 300 in accordance with an exemplary embodiment is shown. The bit line level 300 includes a bit line trace 310 that electrically connects to memory cells 320. The bit line trace 310 includes a first tab 330 and a second tab 335. Multiple tabs allow the same bit line pattern to be used on multiple layers. One of the tabs, such as tab 335 may not be used for connection to a bit line driver since the zias are located in different positions in different device levels. Thus, in different levels, different tabs are connected to different zias, while other tabs remain unconnected to zias.

For example, in a two device level semiconductor device having first and second device levels, the first tab 330 of the bit line trace 310 on a first device level is connected to a first bit line driver on the driver level of the semiconductor device.

However, in this particular example, the second tab 335 of the bit line trace 310 on the first device level is not connected to another driver on the driver level of the semiconductor device. On a second device level (not depicted), using the same bit line pattern as the bit line trace 310, an analogous second tab 335 is connected to a second bit line driver on the driver level of the semiconductor device. However, an analogous first tab 330 on this different second device level is not connected to another driver on the driver level of the semiconductor device. Hence, using the same pattern for two distinct bit line layers on two different device levels, the two distinct bit line layers can be driven by two different bit line drivers. The bit line level 300 also includes zias 340. The zias 340 allow electrical connections to continue to other levels in the semiconductor device.

Figure 4:
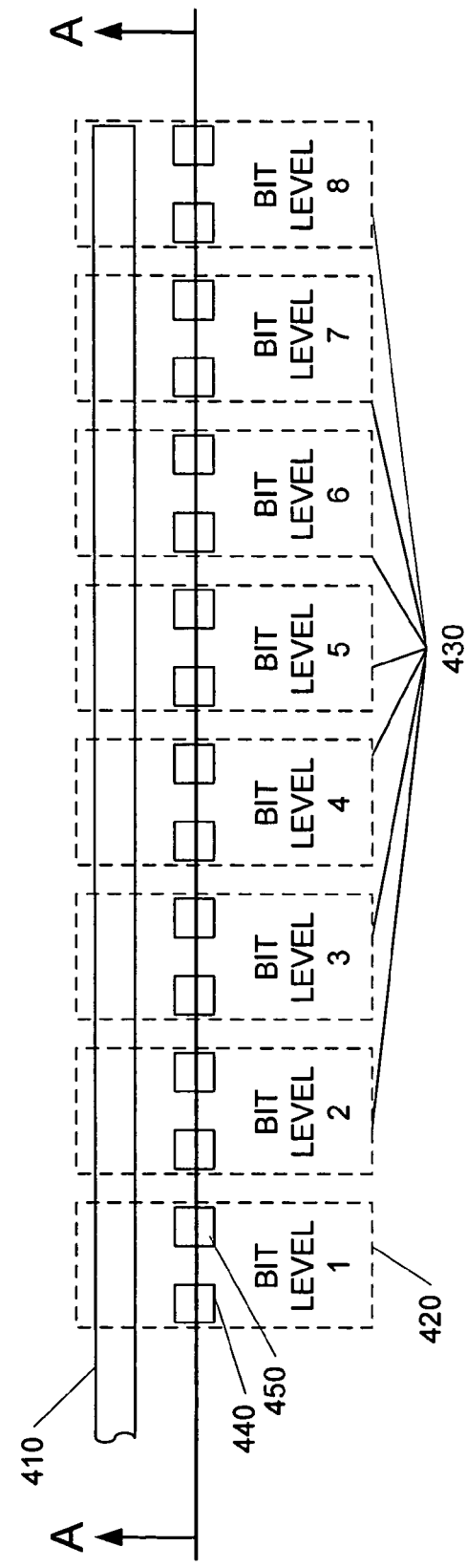
FIG. 4 is a top view diagram of potential zia corridors in accordance with an exemplary embodiment.

Referring to FIG. 4, a top view diagram of potential zia corridors in accordance with an exemplary embodiment is shown. This diagram shows the area of semiconductor device where connections to the bit line driver are made to a bit line 410. Bit line 410 extends to and electrically connects to many memory cells (not shown). In this case, there are eight levels of memory. Each level of memory has its own zia corridor. For example, a first zia corridor 420 is used to route the zias that connect a bit line driver to bit line level 1 which corresponds to memory level 1. Other zia corridors 430 are used to route the zias that connect unique bit line drivers to the other seven bit line levels.

In this case, the first zia corridor 420 bounds a first zia column 440 and a second zia column 450. In other embodiments, zia corridors can have any number of zia columns as well as differing numbers of zia columns amongst zia corridors. Additionally, electrical paths can be routed over and across multiple zia corridors through the use of electrical straps.

Figure 5:
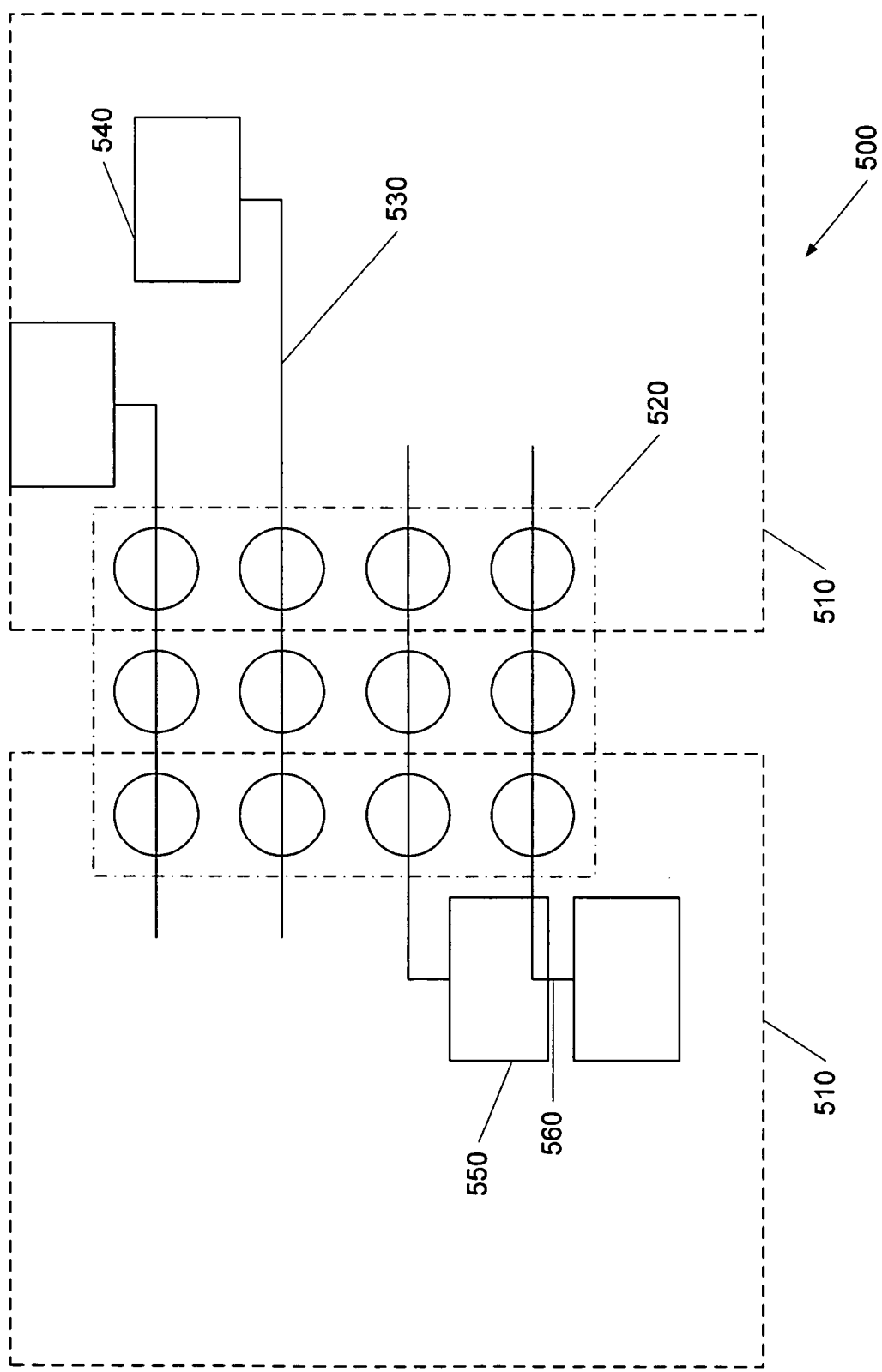
FIG. 5 is a diagram showing zia corridor area layout in accordance with an exemplary embodiment.

Referring to FIG. 5, a diagram showing zia corridor area layout in accordance with an exemplary embodiment is shown. An eight layer three dimensional memory device 500 includes a memory cell array 520, a bit line stack 530, a zia corridor area 540, and a bit line driver area 510. The bit line stack 530 is a vertical stack of bit lines where many of the bit lines share the same or similar patterns. The zia corridor area 540 represents the collective zia routing, as depicted in FIG. 4, of the bit lines in any given vertical stack of bit lines. The bit line driver area 510 represents the space occupied by bit line driver circuitry. In a typical memory design, the electrical connections from a memory layer to the bit line drivers occupy a much smaller area than the bit line driver circuitry. Usually, electrical connections are placed in line with the bit line itself. However, zia corridors are too large, relatively, to be placed in a traditional manner. The overlap of an example zia corridor area 550 and an example bit line 560 shows why zia corridor areas cannot be placed in the traditional manner.

Since the area above the bit line driver area 510 is mostly unused space, the zia corridor area 540 can be relocated away from the memory cell array 520. One row in the memory cell array 520 is electrically connected to the bit line stack 530. The bit line stack 530 is electrically connected, by zias routed through a zia corridor located in the zia corridor area 540, to a bit line driver located in the bit line driver area 510 which is located on a lower level of the eight layer three dimensional memory device 500. The zia corridor area 540 is located away and offset from the centerline of the bit line stack 530 in order to make room for multiple zia corridor areas.

4 Bit Line Masks and 1 Word Line Mask to Build an 8 Layer 3D Memory

Figure 6:
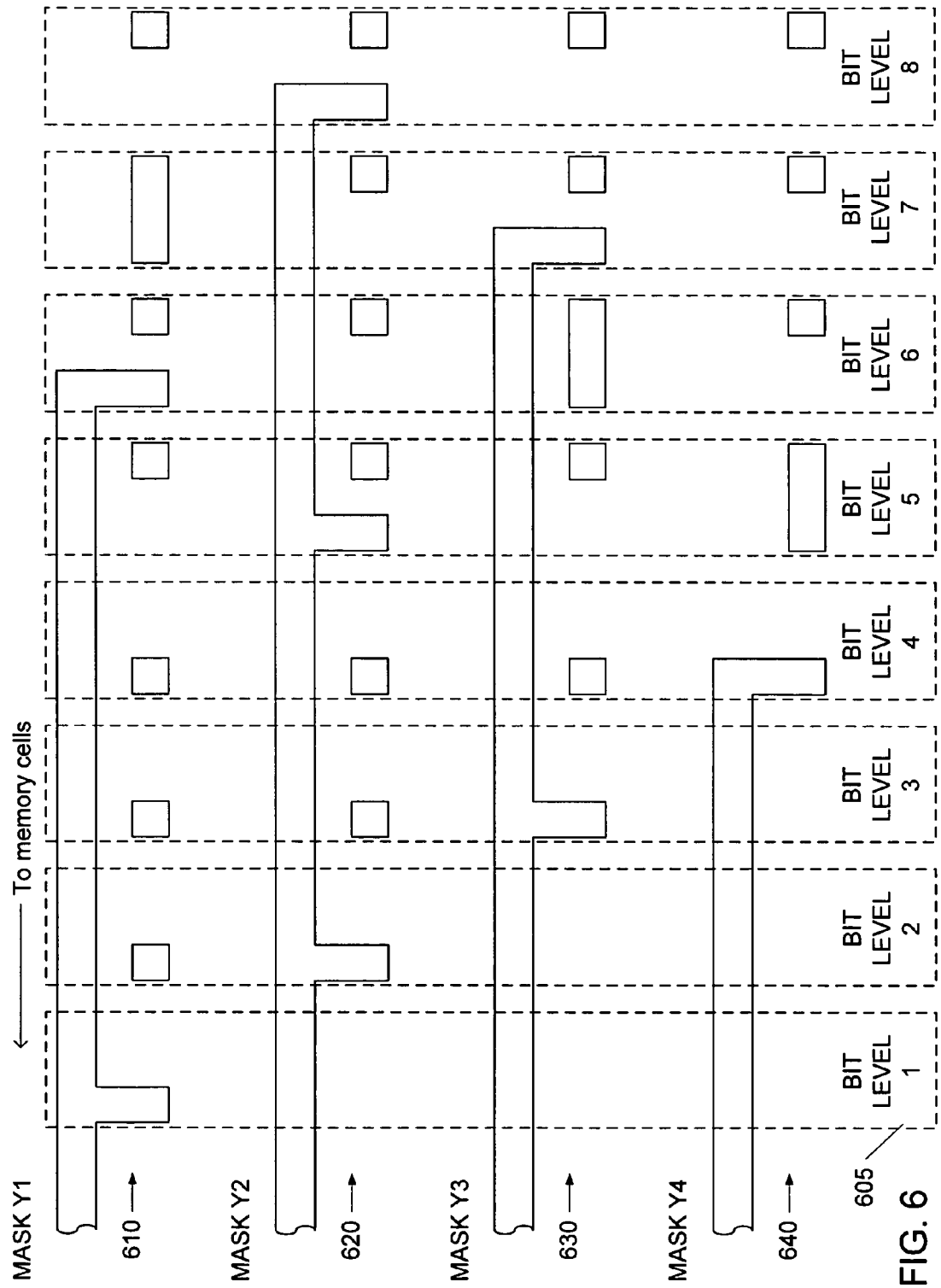
FIG. 6 is a diagram showing mask layouts for bit line levels in accordance with an exemplary embodiment.

In a first embodiment, four bit line masks and one word line mask are used to fabricate an eight layer three dimensional memory device. Referring to FIG. 6, a diagram showing mask layouts for bit line levels in accordance with an exemplary embodiment is shown. The masks and respective patterns are aligned to show how tabs and zias compare within a zia corridor. For instance, a first zia corridor 605 for a bit level 1 connection is shown. Mask Y1 creates a bit line pattern Y1 610. Mask Y2 creates a bit line pattern Y2 620. Mask Y3 creates a bit line pattern Y3 630. Mask Y4 creates a bit line pattern Y4 640. A 'Y' mask denotes that it is a bit line mask.

Figure 7:
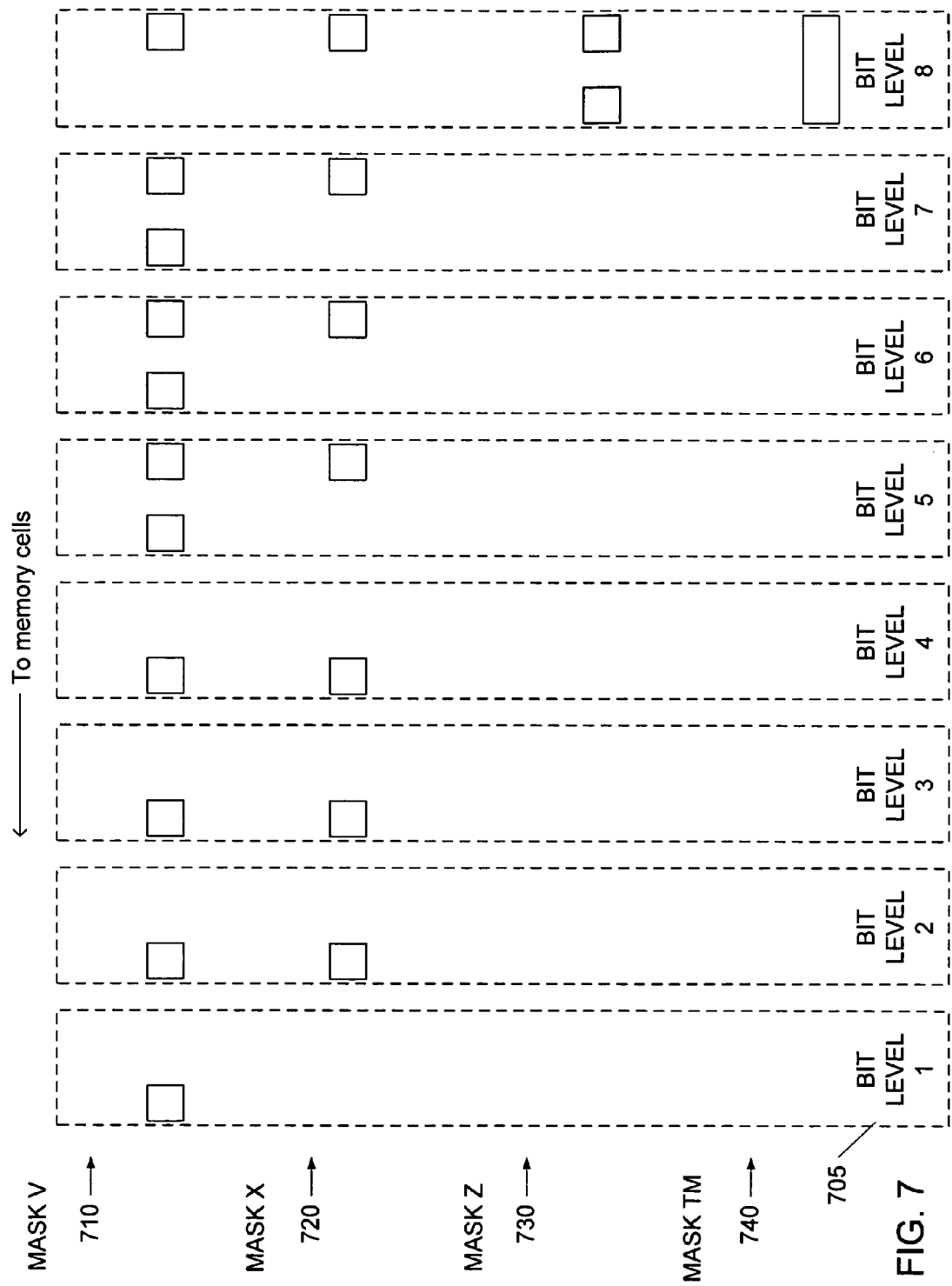
FIG. 7 is a diagram showing mask layouts for intermediate levels in accordance with an exemplary embodiment.

Referring to FIG. 7, a diagram showing mask layouts for intermediate levels in accordance with an exemplary embodiment is shown. The masks and respective patterns are aligned to show how tabs and zias compare within a zia corridor. For instance, a first zia corridor 705 for a bit level 1 connection is shown. Mask V creates an intermediate pattern V 710. A 'V' mask is also referred to as a via mask. Mask X creates an intermediate pattern X 720. A 'X' mask is also referred to as a word line mask. A 'X' mask shape is included on both a word line mask and an X-via mask. The shapes on the word line layer and the X-via layer produced from the masks form a connection from a via shape above the word line to a bit line shape below the X-via. Mask Z creates an intermediate pattern Z 730. A 'Z' mask is also referred to as a zia mask. Mask TM creates a pattern TM 740. A "TM" mask is also referred to as a top metal mask (where a top metal strap is labeled "STRAP" in FIG. 8 for clarity). A three dimensional memory device can include many different intermediate patterns; for example, two via masks can be used.

Figure 8:
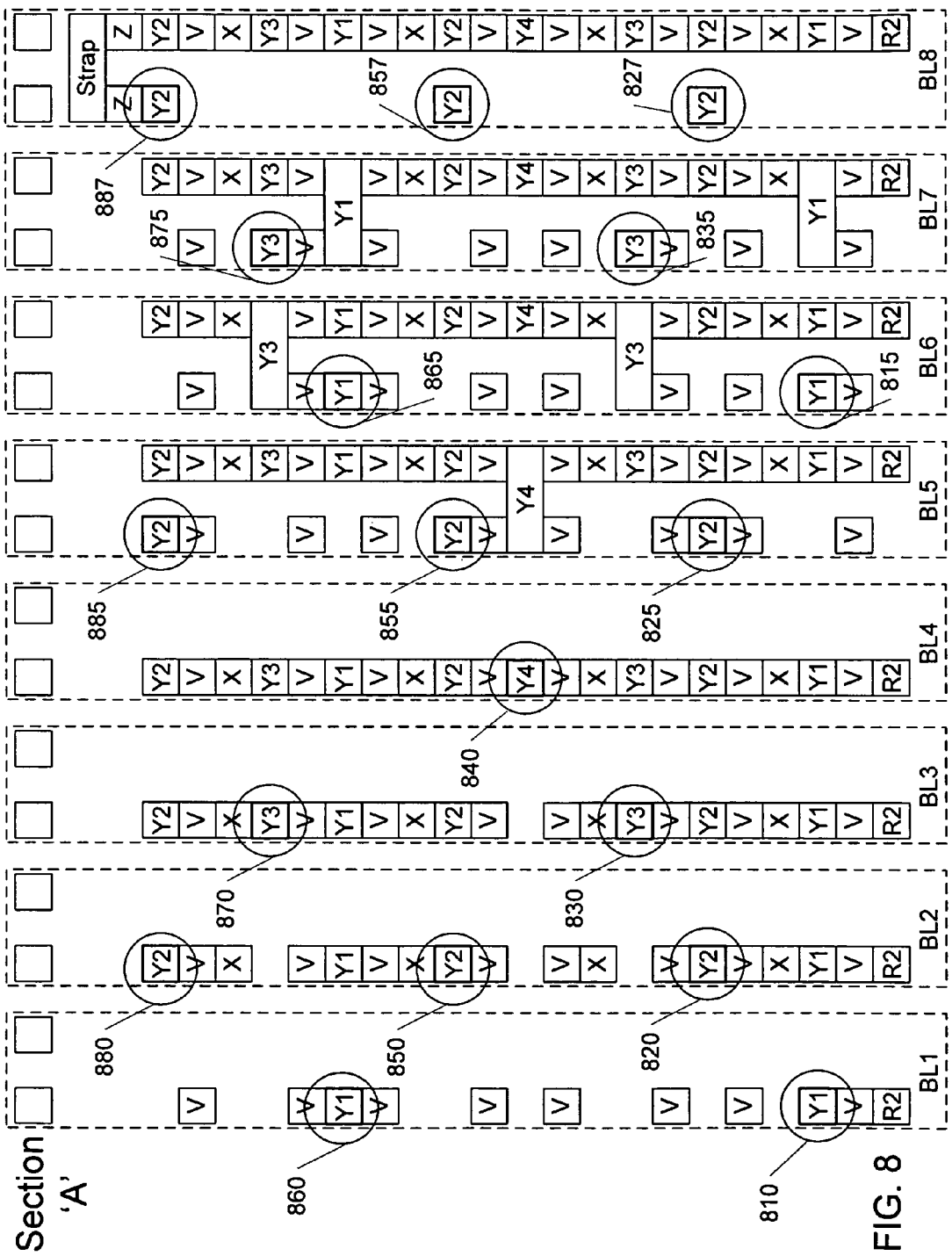
FIG. 8 is a sectional view of a zia corridor area fabricated using the masks depicted in FIGS. 6 and 7 in accordance with an exemplary embodiment.

Referring to FIG. 8, a sectional view of a zia corridor area fabricated using the masks depicted in FIGS. 6 and 7 in accordance with an exemplary embodiment is shown. For each bit line layer (e.g., BL1 to BL8) shown in dashed lines in FIG. 8, the columns corresponding to the square boxes may comprise zia columns and columns between the square boxes correspond to strap columns. The bit line connection layer, R2, has all of the surface connection points that lead to individual bit line drivers on the bit line driver level. Following layer R2, the patterns depicted in FIGS. 6 and 7 are fabricated, from the bottom up in the following order: V, Y1, X, V, Y2, V, Y3, X, V, Y4, V, Y2, X, V, Y1, V, Y3, X, V, Y2, Z, and TM. FIG. 8 shows the sectional view created by sectioning the zia corridors as shown by section 'A' in FIG. 4. Memory cells are not shown. The word line layers, X, are shared between pairs of memory levels.

Referring again to FIG. 8, the individual connections from the bit line drivers to their respective bit line levels are described. The connection for bit line level 1, from R2 to bit line layer 1, is as follows: R2, V, Y1. The connection to bit line layer 1 is by a level one first Y1 tab 810. Notably, a level one second Y1 tab 815 is not electrically connected to anything.

The connection for bit line level 2, from R2 to bit line layer 2, is as follows: R2, V, Y1, X, V, Y2. The connection to bit line layer 2 is by a level two first Y2 tab 820. Notably, a level two second Y2 tab 825 and a level two third Y2 tab 827 are not electrically connected to anything.

The connection for bit line level 3, from R2 to bit line layer 3, is as follows: R2, V, Y1, X, V, Y2, V, Y3. The connection to bit line layer 3 is by a level three first Y3 tab 830. Notably, a level one second Y3 tab 835 is not electrically connected to anything.

The connection for bit line level 4, from R2 to bit line layer 4, is as follows: R2, V, Y1, X, V, Y2, V, Y3, X, V, Y4. The connection to bit line layer 4 is by a level four first Y4 tab 840.

The connection for bit line level 5, from R2 to bit line layer 5, is as follows: R2, V, Y1, X, V, Y2, V, Y3, X, V, a Y4 strap, V, Y2. The connection to bit line layer 5 is by a level five second Y2 tab 855. Notably, a level five first Y2 tab 850 and a level five third Y2 tab 857 are not electrically connected to anything.

The connection for bit line level 6, from R2 to bit line layer 6, is as follows: R2, V, Y1, X, V, Y2, V, Y3, X, V, Y4, V, Y2, X, V, Y1, V, a Y3 strap, and back down to V, and finally Y1. The connection to bit line layer 6 is by a level six second Y1 tab 865. Notably, a level six first Y1 tab 860 is not electrically connected to anything.

The connection for bit line level 7, from R2 to bit line layer 7, is as follows: R2, V, Y1, X, V, Y2, V, Y3, X, V, Y4, V, Y2, X, V, a Y1 strap, V, Y3. The connection to bit line layer 7 is by a level seven second Y3 tab 875. Notably, a level seven first Y3 tab 870 is not electrically connected to anything.

The connection for bit line level 8, from R2 to bit line layer 8, is as follows: R2, V, Y1, X, V, Y2, V, Y3, X, V, Y4, V, Y2, X, V, Y1, V, Y3, X, V, Y2, Z, a TM strap, and back down to Z, and finally Y2. The connection to bit line layer 8 is by a level eight third Y2 tab 887. Notably, a level eight first Y2 tab 880 and a level eight second Y2 tab 885 are not electrically connected to anything. Hence, eight different electrical connections on eight different layers are made to connection points that lead to individual bit line drivers on the bit line driver level despite using only four bit line masks.

3 Bit Line Masks, 1 Word Line Mask, and TM Strap to Build an 8 Layer 3D Memory

Figure 9:
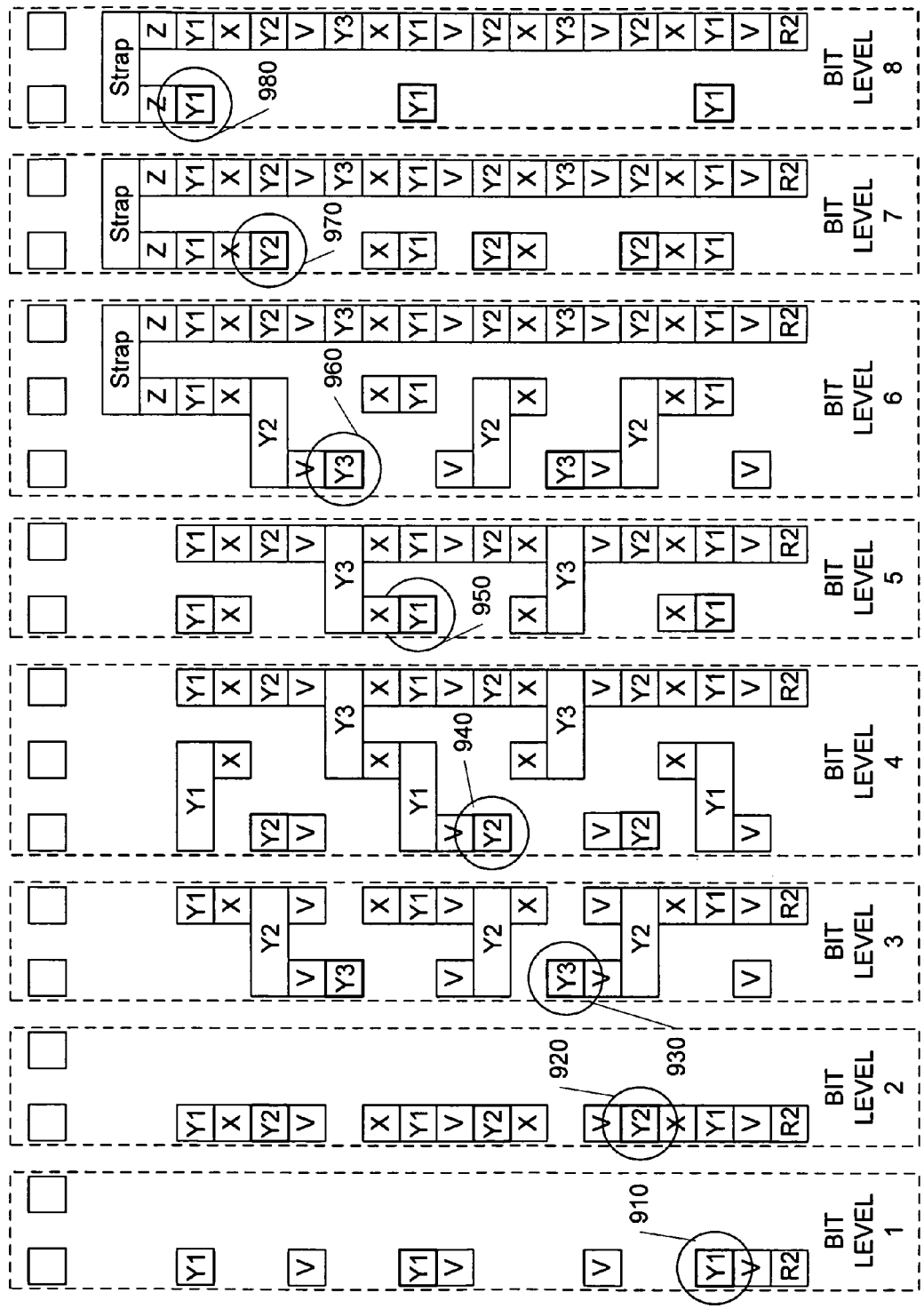
FIG. 9 is a sectional view of a zia corridor area fabricated using three bit line masks in accordance with an exemplary embodiment.

In a second embodiment, three bit line masks, one word line mask, and a top metal (TM) strap are used to fabricate an eight layer three dimensional memory device. Referring to FIG. 9 a sectional view of a zia corridor area fabricated using three bit line masks in accordance with an exemplary embodiment is shown. The bit line connection layer, R2, has all of the surface connection points that lead to individual bit line drivers on the bit line driver level. Following layer R2, layers are fabricated, from the bottom up in the following order: R2, V, Y1, X, Y2, V, Y3, X, Y2, V, Y1, X, Y3, V, Y2, X, Y1, Z, and TM. Note that FIGS. 6 and 7 only relate to FIG. 8. FIG. 9 shows the sectional view created by sectioning the zia corridors as shown by section 'A' in FIG. 4. Memory cells are not shown. The word line layers, X, are shared between pairs of memory levels. A 'X' mask shape is included on both a word line mask and an X-via mask. The shapes on the word line layer and the X-via layer produced from the masks form a connection from a via shape above and below the word line layer to a bit line shape. The zia corridors for bit level 4 and bit level 6 connections each contain three zia columns.

Referring again to FIG. 9, the individual connections from the bit line drivers to their respective bit line levels are described. Terminal tabs are not noted. The connection for bit line level 1, from R2 to bit line layer 1, is as follows: R2, V, Y1. The connection to bit line layer 1 is by a level one first Y1 tab 910. The connection for bit line level 2, from R2 to bit line layer 2, is as follows: R2, V, Y1, X, Y2. The connection to bit line layer 2 is by a level two first Y2 tab 920. The connection for bit line level 3, from R2 to bit line layer 3, is as follows: R2, V, Y1, X, a Y2 strap, V, Y3. The connection to bit line layer 3 is by a level three first Y3 tab 930. The connection for bit line level 4, from R2 to bit line layer 4, is as follows: R2, V, Y1, X, Y2, V, Y3, X, Y2, V, Y1, X, a Y3 strap, then back down to X, a Y1 strap, V, and finally Y2. The connection to bit line layer 4 is by a level four second Y2 tab 940. The connection for bit line level 5, from R2 to bit line layer 5, is as follows: R2, V, Y1, X, Y2, V, Y3, X, Y2, V, Y1, X, a Y3 strap, then back down to X, and finally Y1. The connection to bit line layer 5 is by a level five second Y1 tab 950. The connection for bit line level 6, from R2 to bit line layer 6, is as follows: R2, V, Y1, X, Y2, V, Y3, X, Y2, V, Y1, X, Y3, V, Y2, X, Y1, Z, a TM strap, then back down to Z, Y1, X, a Y2 strap, V, and finally Y3. The connection to bit line layer 6 is by a level six second Y3 tab 960. The connection for bit line level 7, from R2 to bit line layer 7, is as follows: R2, V, Y1, X, Y2, V, Y3, X, Y2, V, Y1, X, Y3, V, Y2, X, Y1, Z, a TM strap, then back down to Z, Y1, X, and finally Y2. The connection to bit line layer 7 is by a level seven third Y2 tab 970. The connection for bit line level 8, from R2 to bit line layer 8, is as follows: R2, V, Y1, X, Y2, V, Y3, X, Y2, V, Y1, X, Y3, V, Y2, X, Y1, Z, a TM strap, then back down to Z, and finally Y1. The connection to bit line layer 8 is by a level eight third Y1 tab 980. Hence, eight different electrical connections on eight different layers are made to connection points that lead to individual bit line drivers on the bit line driver level despite using only three bit line masks.

3 Bit Line Masks, 1 Word Line Mask, a TM Strap, and a X Strap

Figure 10:
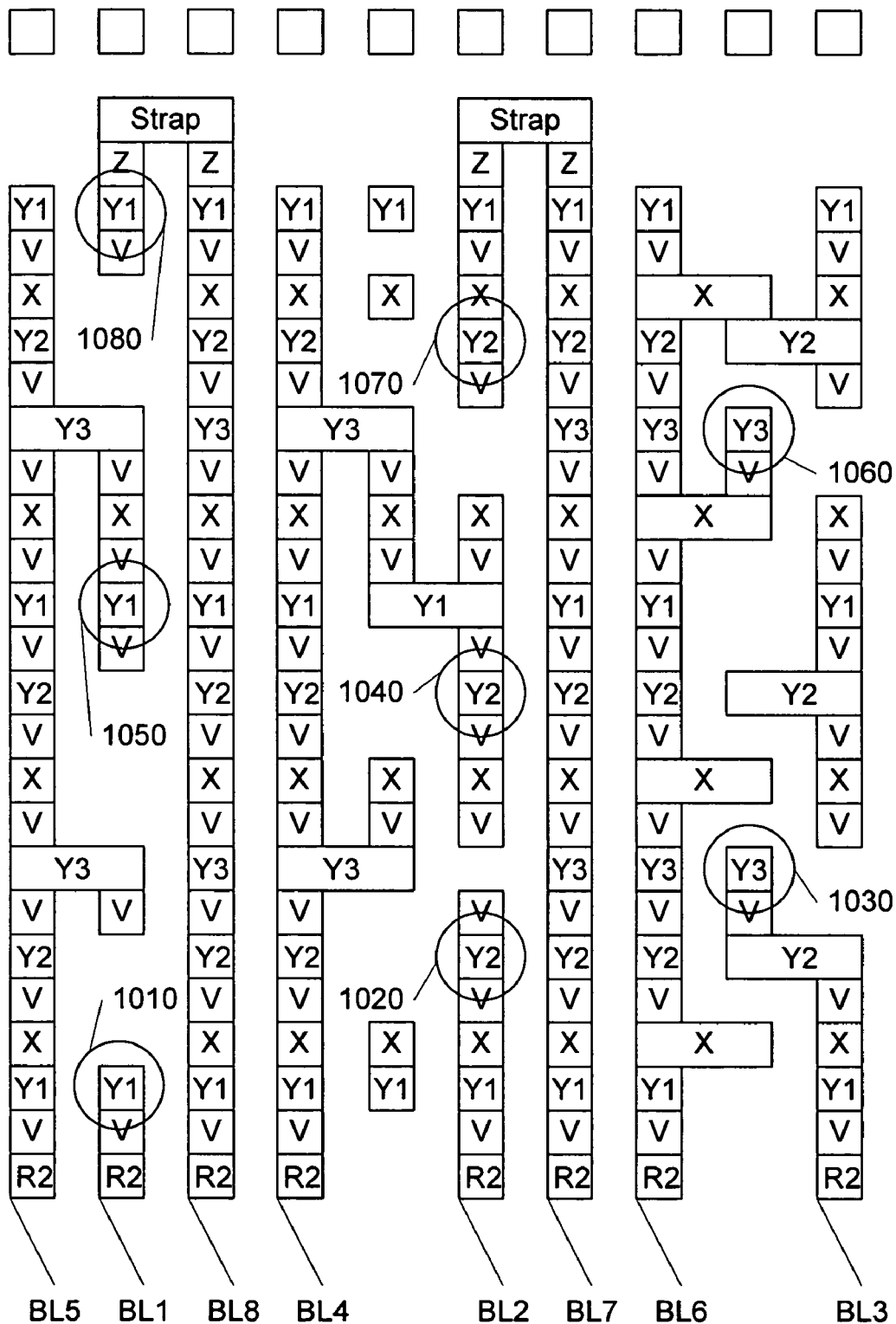
FIG. 10 is a sectional view of a shared zia corridor area fabricated using three bit line masks and a X strap in accordance with an exemplary embodiment.

In a third embodiment, three bit line masks, one word line mask, a top metal (TM) strap, and a X strap are used to fabricate an eight layer three dimensional memory device. Referring to FIG. 10 a sectional view of a shared zia corridor area fabricated using three bit line masks and a X strap in accordance with an exemplary embodiment is shown. The bit line connection layer, R2, has all of the surface connection points that lead to individual bit line drivers on the bit line driver level. Following layer R2, layers are fabricated, from the bottom up in the following order: R2, V, Y1, X, V, Y2, V, Y3, V, X, V, Y2, V, Y1, V, X, V, Y3, V, Y2, X, V, Y1, Z, and TM. Note that FIGS. 6 and 7 only relate to FIG. 8. FIG. 10 shows the sectional view created by sectioning the zia corridors as shown by section 'A' in FIG. 4. Memory cells are not shown. The word line layers, X, are shared between pairs of memory levels. An X-via mask has shapes at all X locations in FIG. 10. Some of the zia corridors are shared.

Referring again to FIG. 10, the individual connections from the bit line drivers to their respective bit line levels are described. Terminal tabs are not noted. The connection for bit line level 1, from R2 to bit line layer 1, is as follows: R2, V, Y1. The connection to bit line layer 1 is by a level one first Y1 tab 1010. The connection for bit line level 2, from R2 to bit line layer 2, is as follows: R2, V, Y1, X, V, Y2. The connection to bit line layer 2 is by a level two first Y2 tab 1020. The connection for bit line level 3, from R2 to bit line layer 3, is as follows: R2, V, Y1, X, V, a Y2 strap, V, Y3. The connection to bit line layer 3 is by a level three first Y3 tab 1030. The connection for bit line level 4, from R2 to bit line layer 4, is as follows: R2, V, Y1, X, V, Y2, V, Y3, V, X, V, Y2, V, Y1, V, X, V, a Y3 strap, then back down to V, X, V, a Y1 strap, V, and finally Y2. The connection to bit line layer 4 is by a level four first Y2 tab 1040. The connection for bit line level 5, from R2 to bit line layer 5, is as follows: R2, V, Y1, X, V, Y2, V, Y3, V, X, V, Y2, V, Y1, V, X, V, a Y3 strap, then back down to V, X, V, and finally Y1. The connection to bit line layer 5 is by a level five first Y1 tab 1050. The connection for bit line level 6, from R2 to bit line layer 6, is as follows: R2, V, Y1, X, V, Y2, V, Y3, V, X, V, Y2, V, Y1, V, a X strap, V, Y3. The connection to bit line layer 6 is by a level six first Y3 tab 1060. The connection for bit line level 7, from R2 to bit line layer 7, is as follows: R2, V, Y, X, V, Y2, V, Y3, V, X, V, Y2, V, Y1, V, X, V, Y3, V, Y2, X, V, Y1, Z, a TM strap, then back down to Z, Y1, V, X, and finally Y2. The connection to bit line layer 7 is by a level seven first Y2 tab 1070. The connection for bit line level 8, from R2 to bit line layer 8, is as follows: R2, V, Y1, X, V, Y2, V, Y3, V, X, V, Y2, V, Y1, V, X, V, Y3, V, Y2, X, V, Y1, Z, a TM strap, then back down to Z, and finally Y1. The connection to bit line layer 8 is by a level eight first Y1 tab 1080. Hence, eight different electrical connections on eight different layers are made to connection points that lead to individual bit line drivers on the bit line driver level despite using only three bit line masks.

Figure 11:
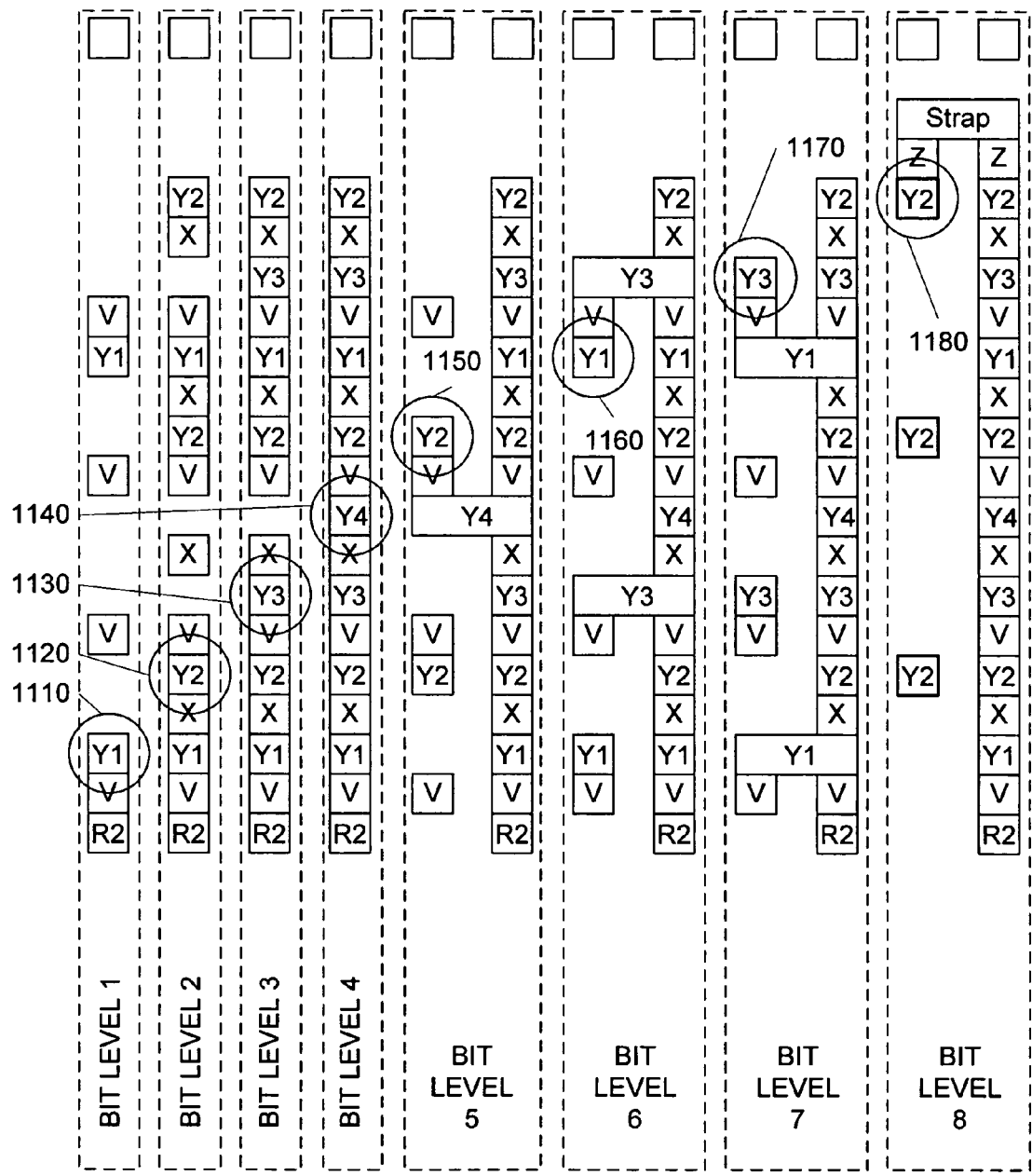
FIG. 11 is a sectional view of a zia corridor area with multiple single zia corridors fabricated using four bit line masks in accordance with an exemplary embodiment.

4 Bit Line Masks and 1 Word Line Mask to Build an 8 Layer 3D Memory Using Multiple Single Zia Corridors In a fourth embodiment, four bit line masks, one word line mask, and a top metal (TM) strap are used to fabricate an eight layer three dimensional memory device. Referring to FIG. 11 a sectional view of a zia corridor area with multiple single zia corridors fabricated using three bit line masks in accordance with an exemplary embodiment is shown. The bit line connection layer, R2, has all of the surface connection points that lead to individual bit line drivers on the bit line driver level. Following layer R2, layers are fabricated, from the bottom up in the following order: R2, V, Y1, X, Y2, V, Y3, X, Y4, V, Y2, X, Y1, V, Y3, X, Y2, Z, and TM. Note that FIGS. 6 and 7 only relate to FIG. 8. FIG. 11 shows the sectional view created by sectioning the zia corridors as shown by section 'A' in FIG. 4. Memory cells are not shown. The word line layers, X, are shared between pairs of memory levels. An X-via mask has shapes at all X locations in FIG. 11. The first four zia corridors have one zia column; the second four zia corridors have two zia columns.

Referring again to FIG. 11, the individual connections from the bit line drivers to their respective bit line levels are described. Terminal tabs are not noted. The connection for bit line level 1, from R2 to bit line layer 1, is as follows: R2, V, Y1. The connection to bit line layer 1 is by a level one first Y1 tab 1110. The connection for bit line level 2, from R2 to bit line layer 2, is as follows: R2, V, Y1, X, Y2. The connection to bit line layer 2 is by a level two first Y2 tab 1120. The connection for bit line level 3, from R2 to bit line layer 3, is as follows: R2, V, Y1, X, Y2, V, Y3. The connection to bit line layer 3 is by a level three first Y3 tab 1130. The connection for bit line level 4, from R2 to bit line layer 4, is as follows: R2, V, Y1, X, Y2, V, Y3, X, Y4. The connection to bit line layer 4 is by a level four first Y4 tab 1140. The connection for bit line level 5, from R2 to bit line layer 5, is as follows: R2, V, Y1, X, Y2, V, Y3, X, a Y4 strap, V, and finally Y2. The connection to bit line layer 5 is by a level five second Y2 tab 1150. The connection for bit line level 6, from R2 to bit line layer 6, is as follows: R2, V, Y1, X, Y2, V, Y3, X, Y4, V, Y2, X, Y1, V, a Y3 strap, then back down to V, and finally Y1. The connection to bit line layer 6 is by a level six second Y1 tab 1160. The connection for bit line level 7, from R2 to bit line layer 7, is as follows: R2, V, Y1, X, Y2, V, Y3, X, Y4, V, Y2, X, a Y1 strap, V, Y3. The connection to bit line layer 7 is by a level seven second Y3 tab 1170. The connection for bit line level 8, from R2 to bit line layer 8, is as follows: R2, V, Y1, X, Y2, V, Y3, X, Y4, V, Y2, X, Y1, V, Y3, X, Y2, Z, a TM strap, then back down to Z, and finally Y2. The connection to bit line layer 8 is by a level eight third Y2 tab 1180. Hence, eight different electrical connections on eight different layers are made to connection points that lead to individual bit line drivers on the bit line driver level despite using only four bit line masks.

4 Bit Line Masks and 1 Word Line Mask to Build an 8 Layer 3D Memory (No Use of TM Layer)

Figure 12:
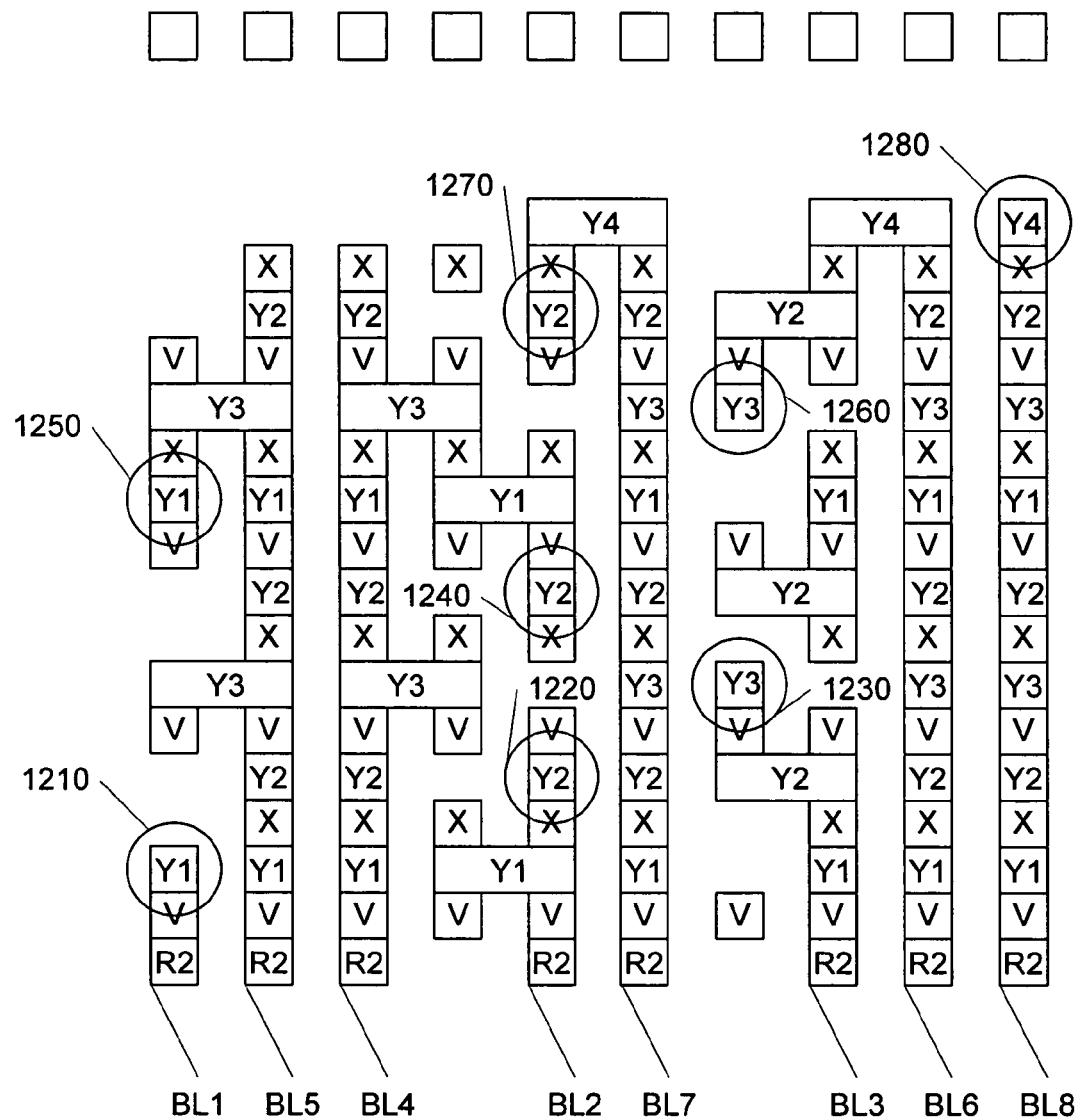
FIG. 12 is a sectional view of a zia corridor area fabricated using four bit line masks and no top metal layer in accordance with an exemplary embodiment.

In a fifth embodiment, four bit line masks and one word line mask are used to fabricate an eight layer three dimensional memory device. Referring to FIG. 12 a sectional view of a zia corridor area fabricated using four bit line masks and no top metal layer in accordance with an exemplary embodiment is shown. The bit line connection layer, R2, has all of the surface connection points that lead to individual bit line drivers on the bit line driver level. Following layer R2, layers are fabricated, from the bottom up in the following order: R2, V, Y1, X, Y2, V, Y3, X, Y2, V, Y1, X, Y3, V, Y2, X, Y4. Note that FIGS. 6 and 7 only relate to FIG. 8. FIG. 12 shows the sectional view created by sectioning the zia corridors as shown by section 'A' in FIG. 4. Memory cells are not shown. The word line layers, X, are shared between pairs of memory levels. An X-via mask has shapes at all X locations in FIG. 12. Some zia corridors are shared.

Referring again to FIG. 12, the individual connections from the bit line drivers to their respective bit line levels are described. Terminal tabs are not noted. The connection for bit line level 1, from R2 to bit line layer 1, is as follows: R2, V, Y1. The connection to bit line layer 1 is by a level one first Y1 tab 1210. The connection for bit line level 2, from R2 to bit line layer 2, is as follows: R2, V, Y1, X, Y2. The connection to bit line layer 2 is by a level two first Y2 tab 1220. The connection for bit line level 3, from R2 to bit line layer 3, is as follows: R2, V, Y1, X, a Y2 strap, V, Y3. The connection to bit line layer 3 is by a level three first Y3 tab 1230. The connection for bit line level 4, from R2 to bit line layer 4, is as follows: R2, V, Y1, X, Y2, V, Y3, X, Y2, V, Y1, X, a Y3 strap, then back down to X, a Y1 strap, V, and finally Y2. The connection to bit line layer 4 is by a level four first Y2 tab 1240. The connection for bit line level 5, from R2 to bit line layer 5, is as follows: R2, V, Y1, X, Y2, V, Y3, X, Y2, V, Y1, X, a Y3 strap, back down to X, and finally Y1. The connection to bit line layer 5 is by a level five first Y1 tab 1250. The connection for bit line level 6, from R2 to bit line layer 6, is as follows: R2, V, Y, X, Y2, V, Y3, X, Y2, V, Y1, X, Y3, V, Y2, X, a Y4 strap, then back down to X, a Y2 strap, V, and finally Y3. The connection to bit line layer 6 is by a level six first Y3 tab 1260. The connection for bit line level 7, from R2 to bit line layer 7, is as follows: R2, V, Y1, X, Y2, V, Y3, X, Y2, V, Y1, X, Y3, V, Y2, X, a Y4 strap, then back down to X, and finally Y2. The connection to bit line layer 7 is by a level seven first Y2 tab 1270. The connection for bit line level 8, from R2 to bit line layer 8, is as follows: R2, V, Y1, X, Y2, V, Y3, X, Y2, V, Y1, X, Y3, V, Y2, X, Y4. The connection to bit line layer 8 is by a level eight first Y4 tab 1280. Hence, eight different electrical connections on eight different layers are made to connection points that lead to individual bit line drivers on the bit line driver level despite using only four bit line masks and no top metal strap.

Advantageously, the number of masks for eight layers of memory can be reduced to seven masks: one memory cell mask, one zia mask, one word line mask, three bit line masks and one X-via mask. The cost of a mask set is reduced substantially. The bit line masks can be used two or three times each resulting in increased manufacturing utilization. Additionally, experimental run mask sets are more cost effective. These lower cost mask sets also make series of product variations more profitable.

The foregoing description of the exemplary embodiments have been presented for purposes of illustration and of description. It is not intended to be exhaustive or to limit the invention to the precise form disclosed, and modifications and variations are possible in light of the above teachings or may be acquired from practice of the invention. For example, the described exemplary embodiments focused on an eight layer implementation using three or four bit line masks. The present invention, however, is not limited to a particular number of layers or masks. Those skilled in the art will recognize that the device and methods of the present invention may be practiced using varying numbers of masks, straps on various layers, as well as with different corridor configurations without deviating from the spirit of the invention. Likewise, each memory layer can be fabricated with its own word line layer, or two word line masks can be used to create two sets of word lines. The memory cells can be any passive element memory array. Additionally, the order of fabrication of the layers may be changed without deviating from the spirit of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

While the invention has been largely described with respect to the embodiments set forth above, the invention is not necessarily limited to these embodiments. For example, the instant invention can also be applied to three-dimensional memory arrays configured as a plurality of levels, where word lines and/or bit lines are shared between levels, including, but not limited to: (1) the memory described in U.S. Pat. No. 6,034,882 issued on Mar. 7, 2000 and U.S. Pat. No. 6,185,122 issued on Feb. 6, 2001, to Mark G. Johnson, et al., both commonly assigned herewith; (2) the memory array described in U.S. patent application Ser. No. 09/560,626 filed on Apr. 28, 2000, in the name of N. Johan Knall and commonly assigned herewith; (3) the memory array described in U.S. patent application Ser. No. 09/814,727 filed on Mar. 21, 2001, in the name of N. Johan Knall and Mark G. Johnson and commonly assigned herewith; The memory described in "Three-Dimensional Memory Array Incorporating Serial Chain Diode Stack" by Kleveland, et al, U.S. patent application Ser. No. 09/897,705, filed on Jun. 29, 2001; the memory described in "Word Line Arrangement Having Multi-Layer Word Line Segments for Three-Dimensional Memory Array," referenced above; and the memory described in U.S. patent application Ser. No. 10/185,508 by Cleeves, filed Jun. 27, 2002, entitled "Three Dimensional Memory", each of which is hereby incorporated by reference.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array. The memory cell may incorporate a reprogrammable memory material for which the conductivity may decrease or increase after application of a suitable electrical pulse.

Such passive element memory cells may generally be viewed as having a current steering element directing current in a direction and another component which is capable of changing its state (e.g., a fuse, an antifuse, a capacitor, a resistive element, etc.). In certain preferred embodiments of the present invention, the memory element is a diode-like structure having a p+ region separated from an n– region by an antifuse element. When the antifuse element is programmed, the p+ region is electrically connected to the n– region and forms a diode. The programming state of the memory element can be read by sensing current flow or voltage drop when the memory element is selected. In an organic PEMA embodiment, the memory element is a diode-like structure having an anode region separated from a cathode region by an organic material layer whose conductivity changes as electrons are injected into the layer.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Specifically an antifuse memory cell is preferred. Other types of memory arrays that are stackable over support circuits, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V ITIMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference. Memory cells comprising resistance change materials including Transition Metal Oxides, as described in more detail in U.S. patent application Ser. No. 11/287,452 by Herner, et al. which is hereby incorporated by reference, and carbon nanotube layers, which may be formed as described in US Patent Pub 20050269553 Sen, Rahul; et al. which is hereby incorporated by reference, or a carbon resistivity switching film, such as a polycrystalline, amorphous or microcrystalline carbon or graphene flake containing film can also be used.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation. Nonetheless, additional details of bias conditions, bias circuits, and layer decoder circuits particularly suitable for a three-dimensional memory array of write-once anti-fuse passive element memory cells are described in U.S. application Ser. No. 09/897,771, entitled "Method and Apparatus for Biasing Selected and Unselected Array Lines When Writing a Memory Array", by Roy E. Scheuerlein, filed on Jun. 29, 2001, and in "Three-Dimensional Memory Array Incorporating Serial Chain Diode Stack" by Kleveland, et al, U.S. patent application Ser. No. 09/897,705, filed on Jun. 29, 2001, which are both hereby incorporated by reference in their entirety.

In the above description, an array line is generally shared by two levels of the memory array (i.e., memory planes).

Alternatively, a memory array may be fabricated having two conductors for each plane that are not shared with other planes. A dielectric layer may be used to separate each such memory level.

Word lines may also be referred to as row lines or X-lines, and bit lines may also be referred to as column lines or Y-lines. The distinction between "word" lines and "bit" lines may carry certain connotations to those skilled in the art. When reading a memory array, it is assumed by some practitioners that word lines are "driven" and bit lines are "sensed." Moreover, the memory organization (e.g., data bus width, number of bits simultaneously read during an operation, etc.) may have some association with viewing one set of the two array lines more aligned with data "bits" rather than data "words." Neither connotation is necessarily intended in this description.

The directionality of X-lines and Y-lines is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of given word. Such various array organizations and configurations are well known in the art, and the invention in intended to comprehend a wide variety of such variations.

The embodiments described may refer to a selected word line being driven to a voltage and a selected bit line being sensed in a read mode, and memory cell anode terminals connected to word lines and cathode terminals connected to bit lines, but other embodiments are specifically contemplated. For example, in a three-dimensional (i.e., multi-level) memory array, an adjacent memory plane may be connected similarly (e.g., a back-to-back diode stack memory array as described in U.S. Pat. No. 6,034,882 to Johnson, et al., referred to above), or may reverse the directionality of memory cells in the adjacent plane (e.g., a serial chain diode stack memory array as described in U.S. patent application Ser. No. 09/897,705 by Kleveland, et al., referred to above) so that the anode terminals are connected to bit lines and the cathode terminals to word lines. Consequently, the designations herein of X-lines, word lines, and row lines, and of Y-lines, bit lines, and column lines are illustrative of the various embodiments but should not be viewed in a restrictive sense, but rather a more general sense. For example, sensing circuits may be coupled to word lines rather than bit lines, or may be used for both word lines and bit lines, when sensing a current in a word line rather than in a bit line. For example, it should be appreciated that the designations X-line and Y-line for various array lines of a memory array on a serial chain diode stack do not necessarily imply which terminal of the memory cells (i.e., anode or cathode) is coupled to the particular line, as with a back-to-back diode stack. An X-line may be coupled to the anode terminal of memory cells in one associated memory plane, and may be coupled to the cathode terminal of memory cells in an adjacent memory plane.

Integrated circuits incorporating a memory array usually subdivide the array into a sometimes large number of smaller arrays, also sometimes known as subarrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array is a monolithic integrated circuit structure, rather than more than one integrated circuit device packaged together or in close proximity, or die-bonded together.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of manufacturing a three dimensional semiconductor device comprising:

using a first bit line mask of at least two bit line masks to form a first bit line layer in a first device level of a plurality of device levels, wherein the first bit line layer comprises first bit lines;

using the first bit line mask to form a second bit line layer in a second device level of the plurality of device levels, wherein the second bit line layer comprises second bit lines, and wherein the first bit lines and the second bit lines have different electrical connections to a bit line connection level;

using the at least two bit line masks to form bit line layers in the plurality of device levels, wherein the bit line layers comprise bit lines, wherein the bit lines of the respective device levels have different electrical connections to the bit line connection level;

using a first device mask set to form a first device layer in the first device level, wherein the first device layer comprises first devices, wherein the first devices are electrically connected to the first bit lines;

using the first device mask set to form a second device layer in the second device level, wherein the second device layer comprises second devices, wherein the second devices are electrically connected to the second bit lines, and wherein the first device mask set comprises at least one device mask; and using a first word line mask to form a first word line layer, wherein the first word line layer comprises first word lines, and wherein the first word lines are shared by the first device level and second device level;

wherein the first devices and second devices comprise a one time programmable or a rewritable cell selected from at least one of antifuse, fuse, diode and antifuse arranged in a series, polysilicon memory effect cell, metal oxide memory, switchable complex metal oxide, carbon nanotube memory, phase change material memory, conductive bridge element, switchable polymer memory, or thin deposited carbon switchable resistor.

2. The method of claim 1 further comprising:

using a first via mask to form via layers amongst the plurality of device levels, wherein the via layers comprise vias, wherein the vias are part of the different electrical connections to the bit line connection level.

3. The method of claim 2 comprising:

using the first bit line mask to form bit lines on three different device levels;

using a second bit line mask to form bit lines on two different device levels;

using a third bit line mask to form bit lines on two different device levels;

using a fourth bit line mask to form bit lines on one device level;

using the first word line mask to form word lines on four different word line layers;

using the first device mask set to form devices on eight different device levels;

using the first via mask to form four different via layers, wherein the respective bit lines of the eight device levels have different electrical connections to the bit line connection level.

4. The method of claim 2 further comprising:

using a first strap mask to form electrical straps, wherein the electrical straps are part of the different electrical connections to the bit line connection level.

5. The method of claim 4 comprising:

using the first bit line mask to form bit lines on three different device levels;

using a second bit line mask to form bit lines on three different device levels;

using a third bit line mask to form bit lines on two different device levels;

using the first word line mask to form word lines on four different word line layers;

using the first device mask set to form devices on eight different device levels;

using the first via mask to form four different via layers;

using the first strap mask to form electrical straps, wherein the respective bit lines of the eight device levels have different electrical connections to the bit line connection level.

6. The method of claim 4 comprising:

using the first bit line mask to form bit lines on three different device levels;

using a second bit line mask to form bit lines on two different device levels;

using a third bit line mask to form bit lines on two different device levels;

using a fourth bit line mask to form bit lines on one device level;

using the first word line mask to form word lines on four different word line layers;

using the first device mask set to form devices on eight different device levels;

using the first via mask to form four different via layers;

using the first strap mask to form electrical straps, wherein the respective bit lines of the eight device levels have different electrical connections to the bit line connection level.

7. A three dimensional semiconductor device comprising:

a first bit line layer of a plurality of bit line layers in a first device level of a plurality of device levels, wherein the first bit line layer has a first bit line pattern, wherein the first bit line layer comprises first bit lines;

a second bit line layer of the plurality of bit line layers in a second device level of the plurality of device levels, wherein the second bit line layer has the first bit line pattern, wherein the second bit line layer comprises second bit lines, and wherein the first bit lines and the second bit lines have different electrical connections to a bit line connection level;

the plurality of bit line layers in the plurality of device levels, wherein at least two of the plurality of bit line layers share a bit line pattern, wherein the plurality of bit line layers comprise bit lines, wherein the bit lines of the respective device levels have different electrical connections to the bit line connection level;

a first device layer in the first device level, wherein the first device layer has a first device pattern, wherein the first device layer comprises first devices, wherein the first devices are electrically connected to the first bit lines;

a second device layer in the second device level, wherein the second device layer has the first device pattern, wherein the second device layer comprises second devices, wherein the second devices are electrically connected to the second bit lines, and wherein the first device pattern is created using at least one device mask; and a first word line layer, wherein the first word line layer has a first word line pattern, wherein the first word line layer comprises first word lines, and wherein the first word lines are shared by the first device level and second device level;

wherein the first devices and second devices comprise a one time programmable or a rewritable cell selected from at least one of antifuse, fuse, diode and antifuse arranged in a series, polysilicon memory effect cell, metal oxide memory, switchable complex metal oxide, carbon nanotube memory, phase change material memory, conductive bridge element, switchable polymer memory, or thin deposited carbon switchable resistor.

8. The three dimensional semiconductor device of claim 7 further comprising:

via layers amongst the plurality of device levels, wherein the via layers have a first via pattern, wherein the via layers comprise vias, wherein the vias are part of the different electrical connections to the bit line connection level.

9. The three dimensional semiconductor device of claim 8 wherein the device comprises eight device levels comprising:

a first three bit line layers on three different device levels, wherein the first three bit line layers share a first bit line pattern;

a first two bit line layers on two different device levels, wherein the first two bit line layers share a second bit line pattern;

a second two bit line layers on two different device levels, wherein the second two bit line layers share a third bit line pattern;

an eighth bit line layer, wherein the eighth bit line layer has a fourth bit line pattern;

four word line layers, wherein the four word line layers share a word line pattern;

eight device layers, wherein the eight device levels share a device layer pattern; and four via layers, wherein the four via layers share a via layer pattern;

wherein the respective bit lines of the eight device levels have different electrical connections to the bit line connection level.

10. The three dimensional semiconductor device of claim 8 further comprising:

electrical straps, wherein the electrical straps are part of the different electrical connections to the bit line connection level.

11. The three dimensional semiconductor device of claim 10 wherein the device comprises eight device levels comprising:

a first three bit line layers on three different device levels, wherein the first three bit line layers share a first bit line pattern;

a second three bit line layers on three different device levels, wherein the second three bit line layers share a second bit line pattern;

a first two bit line layers on two different device levels, wherein the first two bit line layers share a third bit line pattern;

four word line layers, wherein the four word line layers share a word line pattern;

eight device layers, wherein the eight device levels share a device layer pattern;

four via layers, wherein the four via layers share a via layer pattern; and an electrical strap layer, wherein the electrical strap layer includes electrical straps, wherein the electrical straps are part of at least some of the electrical connections to the bit line connection level, wherein the respective bit lines of the eight device levels have different electrical connections to the bit line connection level.

12. The three dimensional semiconductor device of claim 10 wherein the device comprises eight device levels comprising:

a first three bit line layers on three different device levels, wherein the first three bit line layers share a first bit line pattern;

a first two bit line layers on two different device levels, wherein the first two bit line layers share a second bit line pattern;

a second two bit line layers on two different device levels, wherein the second two bit line layers share a third bit line pattern;

an eighth bit line level, wherein the eighth bit line level has a fourth bit line pattern;

four word line layers, wherein the four word line layers share a word line pattern;

eight device layers, wherein the eight device levels share a device layer pattern;

four via layers, wherein the four via layers share a via layer pattern; and an electrical strap layer, wherein the electrical strap layer includes electrical straps, wherein the electrical straps are part of at least some of the electrical connections to the bit line connection level, wherein the respective bit lines of the eight device levels have different electrical connections to the bit line connection level.

* * * * *